United States Patent [19]

Runyan

[11] 4,446,527

[45] May 1, 1984

[54] HIGH ACCURACY MEASURING APPARATUS

[75] Inventor: Wesley G. Runyan, Cedar Rapids, Iowa

[73] Assignee: Rockwell International Corporation, El Segundo, Calif.

[21] Appl. No.: 317,217

[22] Filed: Nov. 2, 1981

Related U.S. Application Data

[62] Division of Ser. No. 128,334, Mar. 7, 1980, Pat. No. 4,321,832.

[51] Int. Cl.³ .............................................. G06F 15/20
[52] U.S. Cl. ................................... 364/558; 364/489; 73/708
[58] Field of Search .................... 364/489, 490, 558; 73/708

[56] References Cited

U.S. PATENT DOCUMENTS 4,253,155  2/1981  Freiday et al. ...................... 364/571
4,293,916 10/1981  Del Re et al. ....................... 364/571
4,321,832  3/1982  Runyan ........................... 364/558 X Primary Examiner—Edward J. Wise
Attorney, Agent, or Firm—Terry M. Blackwood; George A. Montanye; H. Fredrick Hamann

[57] ABSTRACT

A measuring system includes a plurality of resistors and circuitry connected thereto which generates first and second signals each containing different information about one or more of the resistors. Each information is possibly contaminated by error but only by substantially the same error contaminating the other information. Subtraction of two such informations thus gives error-free information because the like errors cancel.

5 Claims, 13 Drawing Figures

HIGH ACCURACY MEASURING APPARATUS

This is a division of application Ser. No. 06/128,334 filed Mar. 7, 1980, now U.S. Pat. No. 4,321,832.

This invention relates to apparatus for measuring resistance with high accuracy and in the preferred application to apparatus for measuring pressure via resistance changes in one or more piezoresistor elements of a strain sensitive device.

Strain sensitive apparatus of the semiconductor piezoresistive type is well known in the art. See for instance (a) Journal of Applied Physics, October 1961, Vol. 32 No. 10, Pages 2008–2019 (b) U.S. Pat. No. 3,049,685 (c) U.S. Pat. No. 3,456,226 and (d) U.S. Pat. No. 3,641,812. Such devices commonly comprise a flexible silicon diaphragm in or on which a plurality of piezoresistive strain gauge elements are essentially integrally formed. The diaphragm commonly comprises crystalline silicon of one conductivity type with the strain gauge piezoresistors formed of opposite conductivity type by diffusion or other appropriate process whereby a p-n junction is achieved. With the diaphragm rigidly supported at its periphery, a transverse force applied centrally to one face causes flexure strain of the diaphragm and attendant changes in resistance of the piezoresistors. Usually at least two of the piezoresistors are arranged relative to each other on the diaphragm so that the force induced diaphragm movement causes one piezoresistor to increase in resistance while the other piezoresistor decreases in resistance. Thus when the force is due to pressure, one resistor varies directly with pressure and the other resistor varies inversely with pressure.

However, the values of these piezoresistors are dependent not only on pressure but also on temperature. More particularly, the resistance of each of these piezoresistors increases with temperature and thus a temperature change, if not properly dealt with, can infuse errors into measurement of pressure with such devices. This problem of piezoresistance dependency on temperature has been recognized and treated by various forms of signal conditioning and temperature compensating circuitry. See for instance U.S. Pat. Nos. 3,956,927; 3,841,150; 3,836,796; and 3,457,493.

Such piezoresistive pressure sensitive devices exhibit other problems and deficiencies. For instance, the pressure signal—i.e., the change in resistance with pressure—is very weak and difficult to observe and thus sensitivity is usually poor. Poor device sensitivity places demands on the equipment with which the changes are measured. For example, component aging and resultant signal drift must be dealt with because the drift component may be a significant portion of the measurement and thus create unsatisfactorily large errors.

In accordance with the present invention, these problems are addressed and circuits affording solution to said problems are provided. These and other features, advantages, and objects of the present invention will become more apparent upon reference to the following specification, claims, and appended drawings in which:

Figure 1:
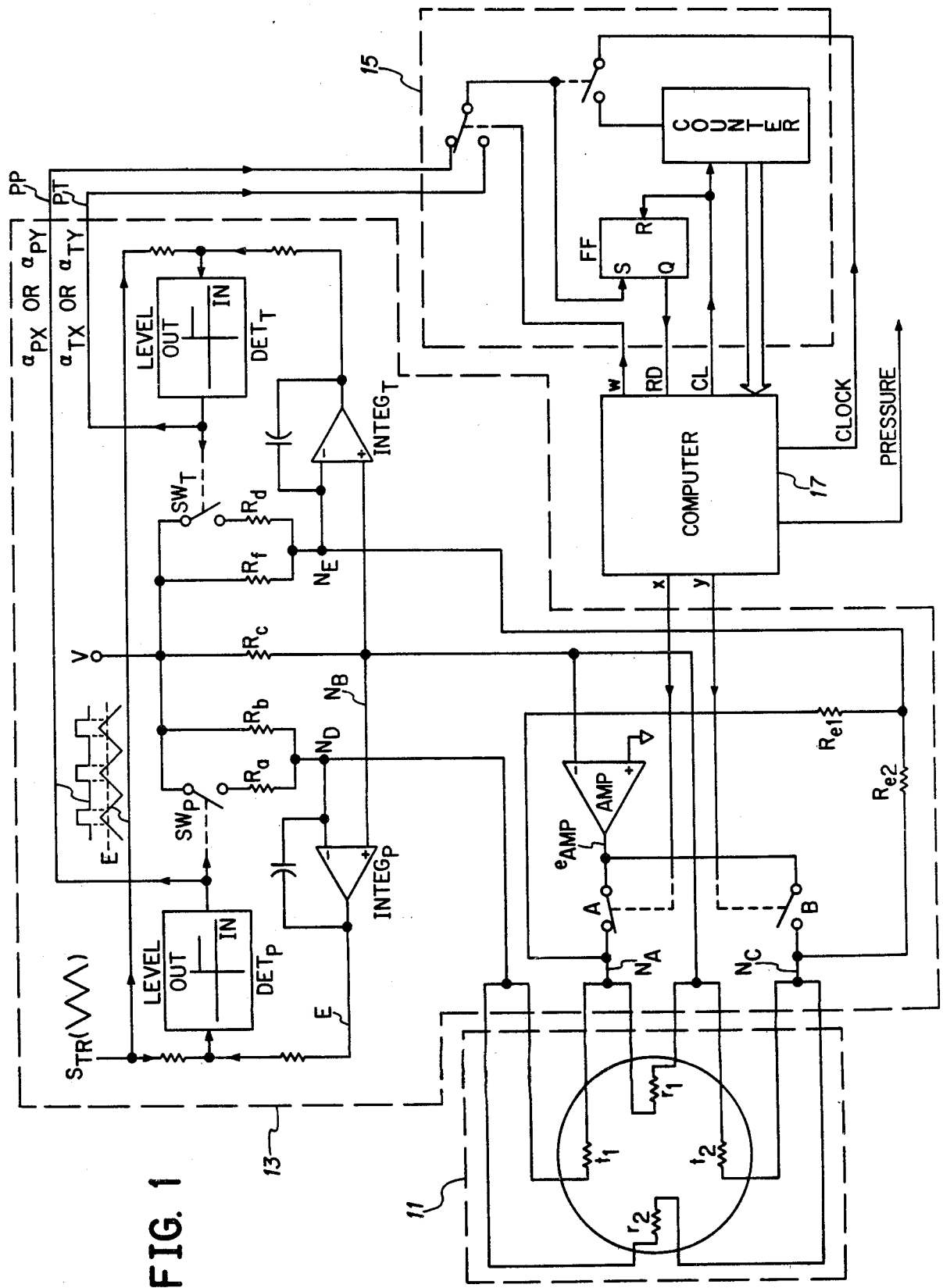
FIG. 1 is a somewhat functional circuit diagram representing the presently preferred embodiment.

Referring now to FIG. 1, piezoresistive pressure assembly 11 includes four piezoresistors $r_1$, $t_1$, $r_2$, and $t_2$ whose values change with changes in pressure or temperature. Analog processing circuitry 13 converts these resistance changes to pulse width modulated signals whose duty ratios (often called duty-cycles) are predetermined functions of one or more of the variables $r_1$, $t_1$, $r_2$, and $t_2$. These pulse width modulated signals are inputted to A/D converter 15 which converts the duty ratios to counts, or digital words. Digital computer 17 receives this digital word form of piezoresistive information and processes same, effecting temperature compensation, linearization, and scaling, and providing an output which is a measurement of pressure. Computer 17 also issues logical commands controlling the entire system, i.e., control signals w, x, y, clear, and clock.

To further preface more detailed explanation hereinafter, four digital words are developed which are representative of, respectively, four different duty ratios. Two of these words are representative of respectively, two different ratios of piezoresistors which vary oppositely with pressure. Further, these same two words are developed using identically the same hardware except for two switches. These two words are differenced thereby producing a strongly pressure sensitive word which is largely independent of temperature variations and which, due to extraneous error canceling from the subtraction, is substantially free of circuit induced errors. The other two words are summed, thereby producing a strongly temperature sensitive word which is used in the computer to further compensate the pressure sensitive word and provide an even more accurate measurement of pressure.

As will be seen in even greater detail hereinafter, piezoresistors $r_1$ and $r_2$ both increase in value as pressure increases. Piezoresistors $t_1$ and $t_2$ both decrease in value as pressure increases. All four resistors $r_1$, $r_2$, $t_1$, and $t_2$, increase in value as temperature increases.

With circuit 13 switches A and B respectively closed and open (as illustrated), and in said states long enough for steady state conditions to prevail, circuit 13 ports PP and PT output, respectively, two pulse width modulated signals whose respective duty ratios $a_{PX}$ and $a_{TX}$ obey the following expressions:

$$a_{PX} = \left(\frac{R_a}{R_c}\right)\left(\frac{r_1}{t_1}\right) - \left(\frac{R_a}{R_b}\right) + \epsilon_P$$

$$a_{TX} = \left(\frac{R_d}{R_c}\right)\left(\frac{r_1}{R_{e1}}\right) - \left(\frac{R_d}{R_f}\right) + \epsilon_T$$

At a later time, with circuit 13 switches A and B respectively open and closed and in such states long enough for steady state conditions to prevail, circuit 13 ports PP and PT output, respectively, two pulse width modulated signals whose respective duty ratios $a_{PY}$ and $a_{TY}$ obey the following expressions:

$$\alpha_{PY} = \left(\frac{R_a}{R_c}\right)\left(\frac{t_2}{r_2}\right) - \left(\frac{R_a}{R_b}\right) + \epsilon_P$$

$$\alpha_{TY} = \left(\frac{R_d}{R_c}\right)\left(\frac{t_2}{R_{e2}}\right) - \left(\frac{R_d}{R_f}\right) + \epsilon_T$$

Duty ratio is defined as $T_1/(T_1+T_2)$ where, for $\alpha_{PX}$ and $\alpha_{PY}$, $T_1$ is the time duration corresponding to the state where current passes from $R_a$ to node $N_D$, and $T_2$ is the time duration corresponding to the state where no current passes from $R_a$ to node $N_D$. For $\alpha_{TX}$ and $\alpha_{TY}$, $T_1$ and $T_2$ correspond to durations respectively of current and no current, from $R_d$ to node $N_E$. $\epsilon_P$ and $\epsilon_T$ are zero-offset types of errors that can occur in the measurement. These errors are not quantified nor adjusted out by the circuitry 13. It is important to note however, that the same error $\epsilon_P$ appears in both $\alpha_{PX}$ and $\alpha_{PY}$. That is, the exact size of the error is unknown but is repeatable. Likewise, an error $\epsilon_T$ appears in both $\alpha_{TX}$ and $\alpha_{TY}$, $\epsilon_T$ being unknown as to magnitude but, as with $\epsilon_P$, being repeatable.

Under control of the computer signals w, x, y, and clear, the A/D converter 15 receives, at four different times, the four different analog measurements, namely the four $\alpha$'s, and converts same into four different digital counts or digital words. Converter 15 uses a gated clock into a counter and the counter outputs the digital words $W_{PX}$, $W_{PY}$, $W_{TX}$, and $W_{TY}$ which correspond respectively to $\alpha_{PX}$, $\alpha_{PY}$, $\alpha_{TX}$, and $\alpha_{TY}$.

These four words are read into the computer 17 and are processed to produce digital output representative of ambient pressure at the sensor 11. In the computer each of the four words is first filtered in a digitally embodied low-pass filter and then each of the filtered digital words (namely, $P_X$, $P_Y$, $T_X$, and $T_Y$) is stored in its own digital memory. Next is effected a step which produces important and desirable effects. That is, the subtraction $(P_X - P_Y) = P$ is performed thereby producing cancellation of the offset error $\epsilon_P$. More particularly, with the exception of circuit 13 switches A and B, the measurements leading to $P_X$ and $P_Y$ are accomplished with identically the same hardware and thus, as hereinabove indicated, the measurement error in both $P_X$ and $P_Y$ is substantially the same error $\epsilon_P$. Thus since $(\epsilon_P - \epsilon_P) = 0$, the computed word P is practically error free.

Also, since P is proportional to $(R_a/R_c)[(r_1/t_1) - (t_2/r_2)]$, sensitivity is considerably increased relative to a single piezoresistor. More particularly, the ratio $(r_1/t_1)$ increases with pressure not only due to an increasing numerator $r_1$ but also due to a simultaneously decreasing denominator $t_1$. Secondly, the ratio $(t_2/r_2)$ decreases with pressure not only due to a decreasing numerator $t_2$ but also to a simultaneously increasing denominator $r_2$. Thirdly, when the oppositely moving ratios are subtracted the sensitivities are additive and overall sensitivity is further increased.

Also, accomplished in the computer is the addition $T_X + T_Y = T$.

As a result of the processing, the word P is strongly pressure sensitive and largely, but not completely, independent of temperature. Also, the word T is strongly temperature sensitive but not altogether independent of pressure. Thus, both P and T are still somewhat contaminated in the sense that both P and T, although principally sensitive to one of the variables of pressure or temperature, are dependent on both variables. However, since a given pressure and a given temperature produce a particular and corresponding pair of [P, T] values (one value for P and one value for T), conversely, any particular pair of P and T values correspond to a particular pair of pressure-temperature values (one value for pressure and one value for temperature). This correspondence is derived empirically for each individual sensor 11 and is reduced to characterizing constants which are entered in computer 17 memory. Computer 17 is programmed to compute according to predetermined polynomial functions using the stored characterizing constants and the P and T words, and outputs a digital word representative of true ambient pressure at sensor 11.

Further detailed description of the FIG. 1 system elements follows hereinbelow.

FURTHER DESCRIPTION OF SENSOR 11

Figure 2A:
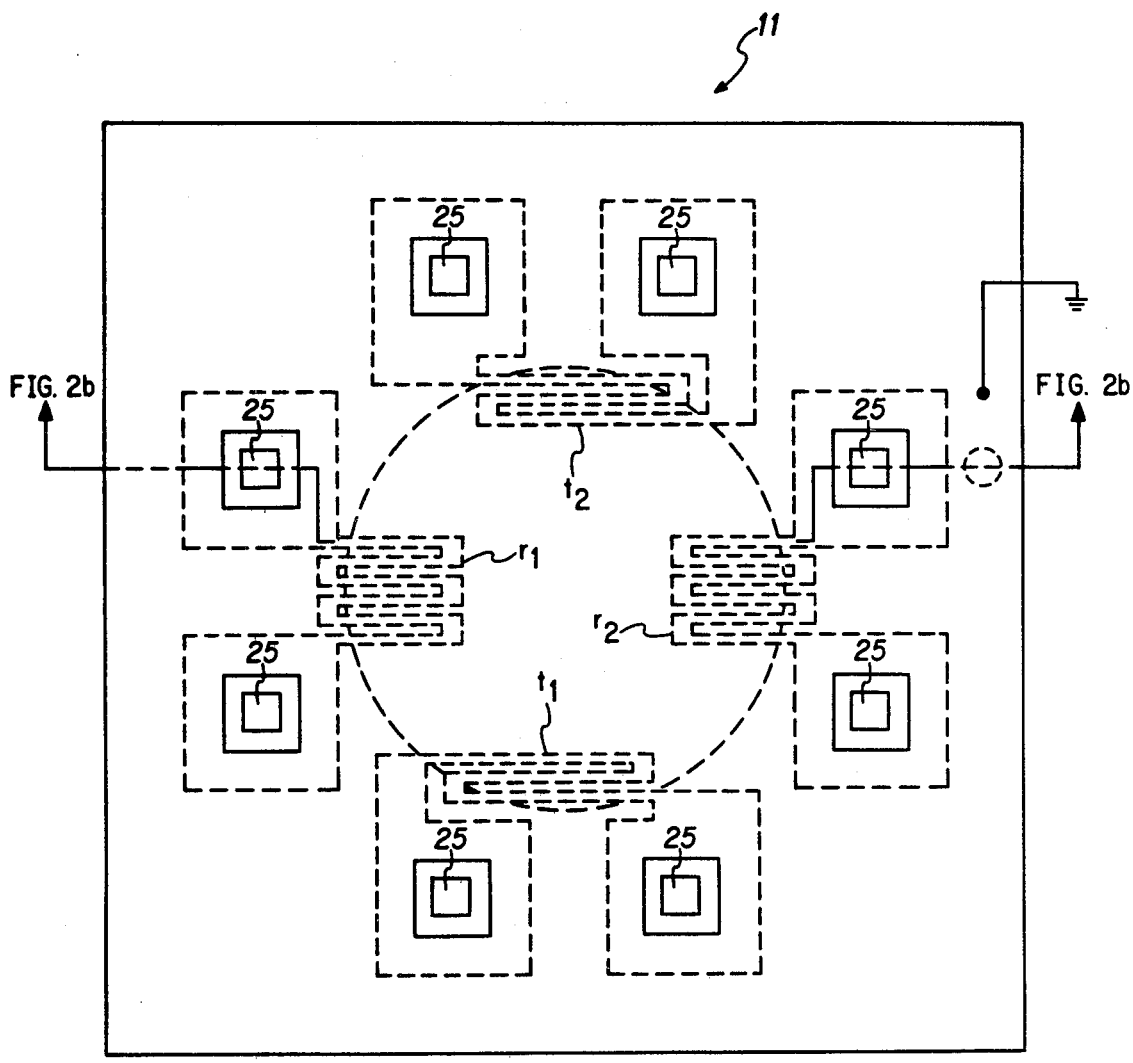
FIGS. 2a and 2b are diagrammatic views, top and side sectional respectively, representing the presently employed piezoresistive semi-conductor pressure sensor 11.
Figure 2B:
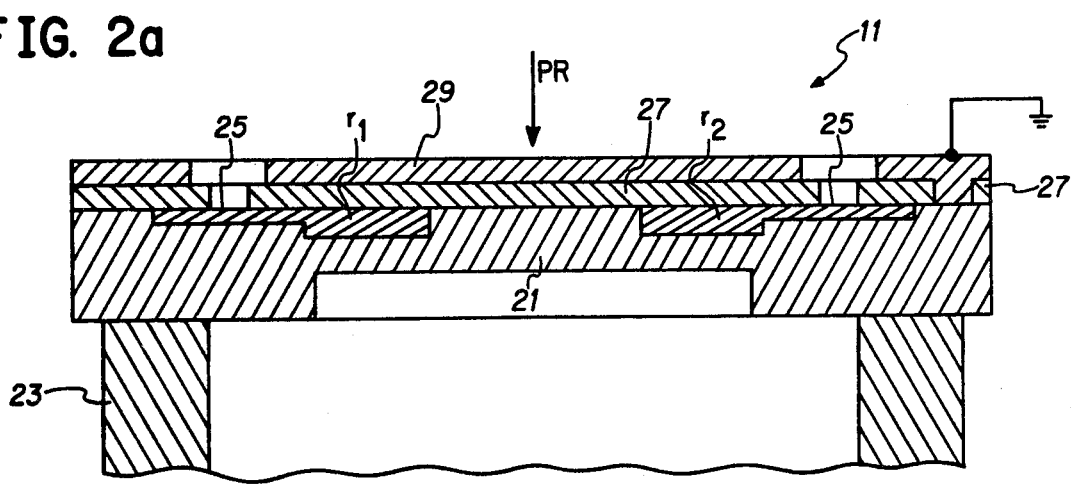

Referring now to FIGS. 2a and 2b, therein is represented a piezoresistive pressure sensor 11 employed with the present invention. A diaphragm 21 of n-type material is secured at its periphery to a tube 23. Diffused into diaphragm 21 are four piezoresistors $r_1$, $r_2$, $t_1$, and $t_2$, each of p-type material. Metallized pads 25 permit wire connections to be made to said piezoresistors. An insulating layer 27 of silicon dioxide covers the entire assembly, except that holes in the insulating layer are formed to allow contact with pads 25. In addition, a guard-plate layer 29 of conductive polysilicon covers the insulating layer 27, again with holes to allow contact to pads 25. These layers 27 and 29 are to protect the piezoresistors from contamination and moisture. The n-type material and the conductive guard-plate are connected to ground reference potential. As force or pressure PR increases, the diaphragm flexes slightly and causes the resistances of said four piezoresistors to change. More particularly, the resistances of $r_1$ and $r_2$ increase with increasing pressure and the resistances of $t_1$ and $t_2$ decrease with increasing pressure. All four increase with increasing temperature.

As a specific example, all four resistances $r_1$, $t_1$, $r_2$, $t_2$ may have a common value of 2500 ohms at low ambient temperature (for instance, at $-55$ degrees Celsius) and with zero applied pressure (PR=0). At low ambient temperature but with one atmosphere (approximately 29.92 inches of mercury) of applied pressure, the resistances may change to the values $r_1 = 2525$ ohms, $t_1 = 2475$ ohms, $r_2 = 2525$ ohms, and $t_2 = 2475$ ohms. That is, resistances $r_1$ and $r_2$ may increase by one percent of their original values while resistances $t_1$ and $t_2$ may decrease by one percent of their original values, all of these effects being due only to a one atmosphere increase in applied pressure. Alternatively, with high ambient temperature (for instance, at $+100$ degrees Celsius) but with the original zero applied pressure, the resistances may change to the values $r_1 = 2875$ ohms, $t_1 = 2875$ ohms, $r_2 = 2875$ ohms, and $t_2 = 2875$ ohms. That is, all four resistances may increase in value by fifteen percent of their original values as ambient temperature increases through a 155 degree Celsius range. It should be understood that neither the pressure sensitivity nor the temperature sensitivity of the four resistors will be precisely as described in this example since there are independent random variations in the characteristics of each resistor. This example is, however, representative and, moreover, illustrates the orders of magnitude of the pressure induced resistance changes which are detected, and the temperature induced resistance changes which are dealt with, by use of the inventive principles herein.

FURTHER DESCRIPTION OF CIRCUITRY 13

Figure 3:
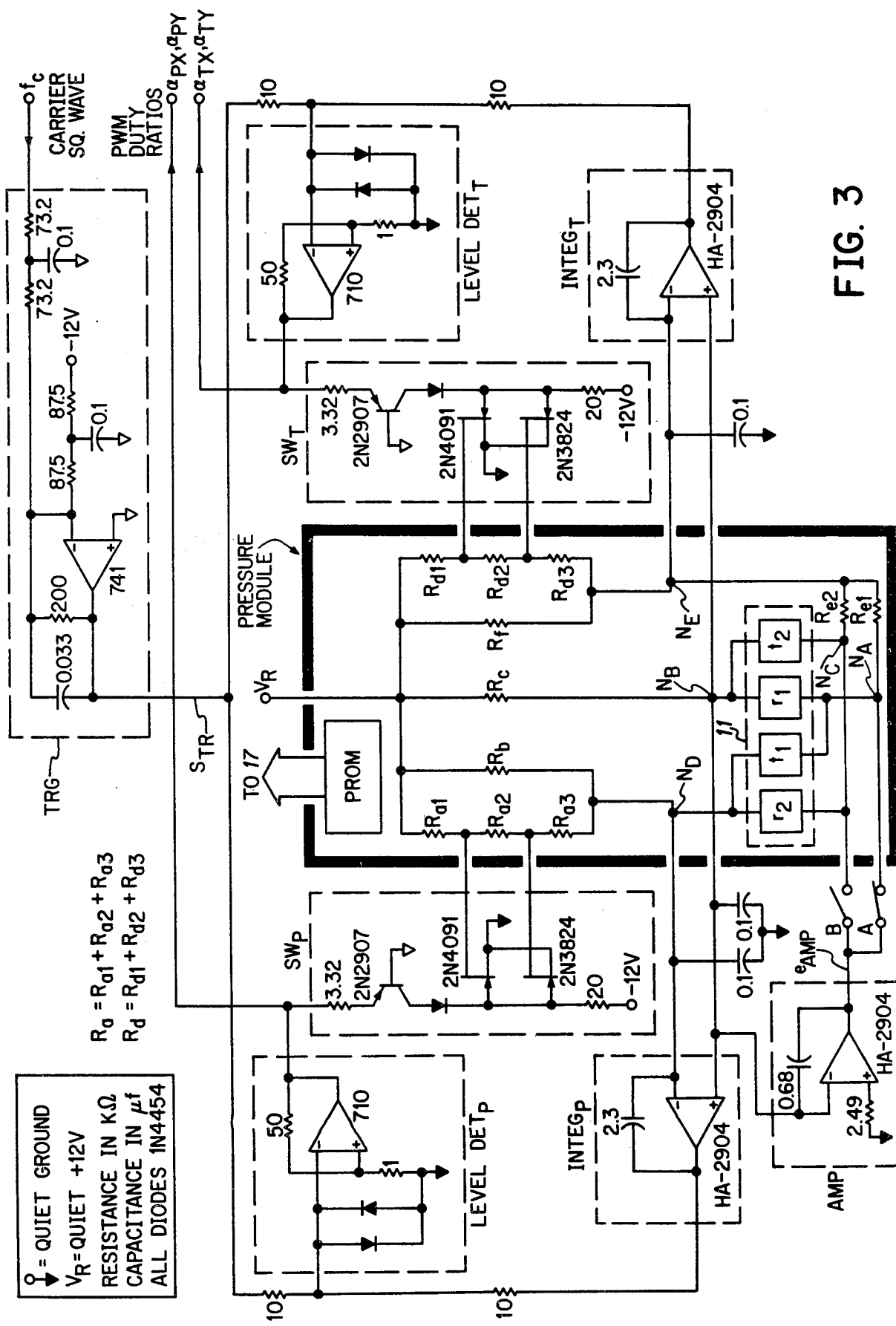
FIGS. 3 and 4 are circuit diagrams showing parts of the FIG. 1 embodiment in greater detail.

Referring now to FIG. 3, therein is shown a more detailed schematic of the analog processing circuitry 13 of FIG. 1. Also included in FIG. 3 is another representation of the pressure sensor 11.

It should be noted that resistors $R_a$ and $R_d$, and switches $SW_P$ and $SW_T$, are represented somewhat differently in FIG. 3 than in FIG. 1 although the same function is accomplished, namely, controlling the current flowing to nodes $N_D$ and $N_E$ from resistors $R_a$ and $R_d$. In the present implementation, as represented by FIG. 3, each of $R_a$ and $R_d$ comprise three components whose sums equal, respectively, $R_a$ and $R_d$, and each of $SW_P$ and $SW_T$ employs two FET transistors driven and connected in cascade to shunt all the current in the $R_a$ (or $R_d$) leg to ground.

Also shown in FIG. 3 is a triangular wave generator TRG which receives from 15 a square wave and outputs triangular signal $S_{TR}$. As will be seen below, the received square wave is a frequency divided form of the computer clock signal. Each level detector outputs a "0" or a "1," respectively, depending on whether $S_{TR}$ is above or below the negative of the integrator output. As indicated in FIG. 3, both level detectors may be type 710. The op-amps in both integrators (INTEG) and in the amplifier (AMP) may be, as indicated, each a type HA-2904. Switches A and B are solid-state silicon analog switches. All diodes may be type 1N4454. $R_{a1}$, $R_{a2}$, $R_{a3}$, $R_b$, $R_c$, $R_{d1}$, $R_{d2}$, $R_{d3}$, $R_{e1}$, $R_{e2}$, and $R_f$ are typically ±0.1% Vishay resistors with respective values in kilohms of 1.21, 82.5, 73.2, 25.5, 23.7, 1.21, 52.5, 73.2, 56.2, 56.2, and 664. Other details of component values or type number may be seen from FIG. 3.

In operation, switch A is closed while switch B is open, and vice-versa. With switch A closed, the output of amplifier AMP is connected to the interconnected ends of $r_1$ and $t_1$, i.e., node $N_A$. During this state of switch A, the feedback elements $INTEG_P$ and $LEVEL DET_P$ serve to assure that the average potential at node $N_D$ remains substantially independent of variations in $r_1$ and/or $t_1$. Moreover, due to the high gain through the feedback elements, and due to the high gain of AMP, the average potential at node $N_D$, and the potential at node $N_B$, are maintained substantially at a same constant reference potential. As $r_1$ and/or $t_1$ vary, the dc output of $INTEG_P$ rises or falls causing $LEVEL DET_P$ output signal duty ratio to change which in turn, via opening or closing $SW_P$, affects the average current from $R_a$ into $N_D$. The $LEVEL DET_P$ output is a pulse width modulated signal whose duty ratio in the steady state is the aforementioned $\alpha_{PX}$.

The hereinabove described ideal expression for $\alpha_{PX}$ can be derived by summing currents into the integrator $INTEG_P$ input nodes $N_D$ and $N_B$. More specifically, with circuit 13 switch A closed (and switch B open) the sum of currents into node $N_D$ is $[(V_R/R_b) + \alpha_{PX}(V_R/R_a) + (e_{AMP}/t_1)]$ and the sum of currents into node $N_B$ is $[(V_R/R_c) + (e_{AMP}/r_1)]$. Each of these sums is ideally zero in the steady state, and solution of the resulting two equations gives the hereinabove shown ideal expressions for $\alpha_{PX}$.

Operation of the elements shown in the right-hand side of FIG. 3 is analogous to that just described and thus the output of $LEVEL DET_T$ is a pulse width modulated signal whose duty ratio in the steady state is the aforementioned $\alpha_{TX}$. Similar to statements relative to $\alpha_{PX}$, the ideal expression for $\alpha_{TX}$ can be derived by summing currents into the input nodes $N_E$ and $N_B$ of $INTEG_T$.

Analogously, with switch A open and switch B closed, $LEVEL DET_p$ and $LEVEL DET_T$ output two pulse width modulated signals whose duty ratios are, respectively, the above-mentioned $\alpha_{PY}$ and $\alpha_{TY}$. The hereinabove given ideal expressions for $\alpha_{PY}$ and $\alpha_{TY}$ may be derived in analogous manner to that shown for $\alpha_{PX}$.

For additional detail on principles of operation of circuitry 13, and on sensor 11, my U.S. patent application Ser. No. 011,251 entitled "Circuitry for Strain Sensitive Apparatus," now U.S. Pat. No. 4,205,556, and assigned to the assignee of the present application, is hereby incorporated by reference.

It should again be noted that in the providing of $\alpha_{PX}$ and $\alpha_{PY}$ the very same $R_a$, $R_b$, $R_c$, $INTEG_P$, $LEVEL DET_P$, and $S_{TR}$ are employed.

To preface further detail hereinbelow, it should also be noted that resistors $R_a$ through $R_f$, resistors $r_1$, $t_1$, $r_2$, $t_2$, and a PROM are brought together on a single unit or assembly called a pressure module. These components are wedded together as a set such that replacement of any one set component by itself is not readily or casually accomplished. When replacement or change is effected, the entire set or module is replaced. The benefit of "marrying" these components into a set is that, to maintain high measurement accuracy, high precision resistors are not needed for $R_a$ through $R_f$. The piezoresistors and the $R_a$ through $R_f$ are the only arguments of the analog or digitized $\alpha$'s, and the PROM wedded therewith contains customized data for compensating this particular set of resistors.

FURTHER DESCRIPTION OF A/D CONVERTER 15

Figure 4:
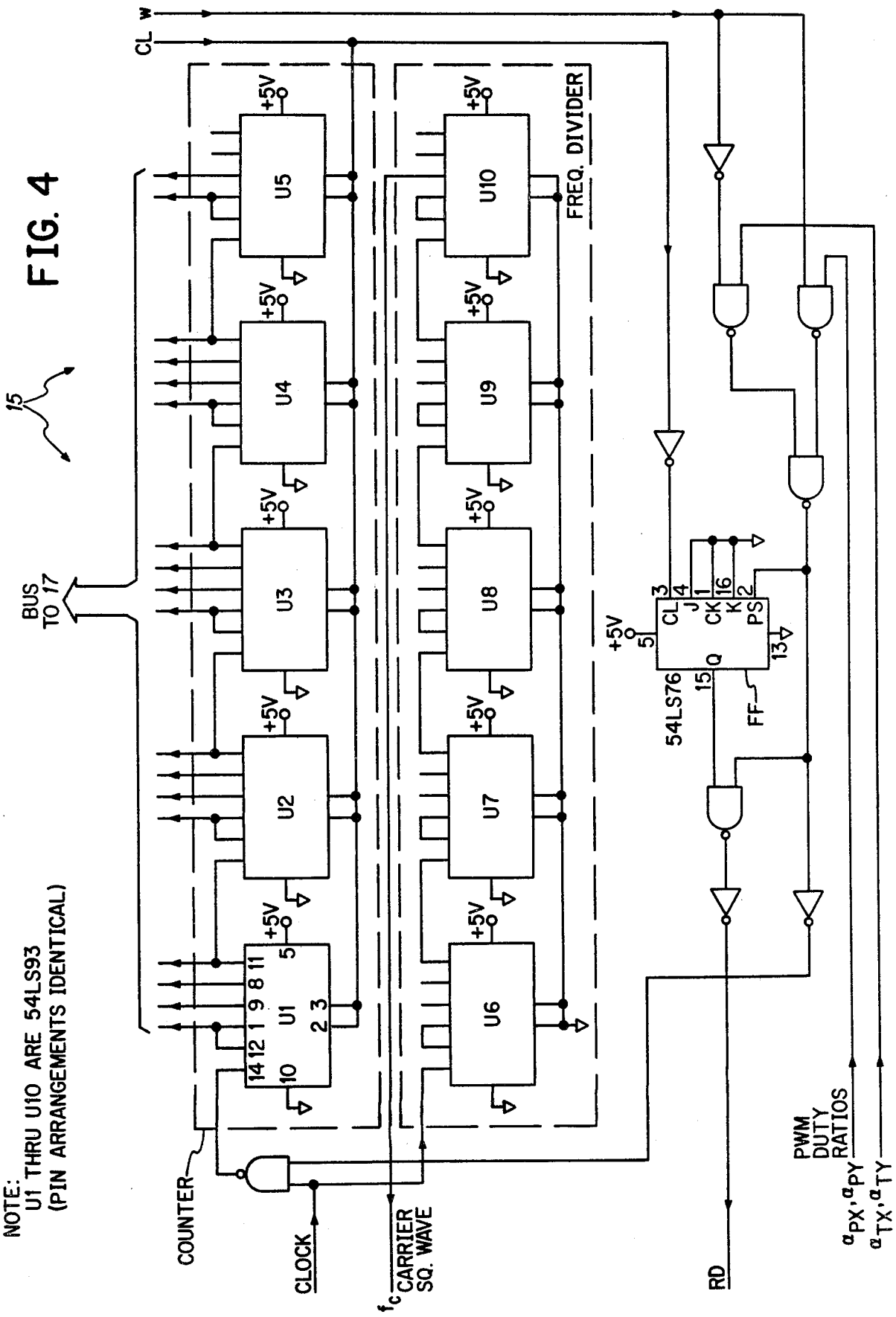

As seen from FIG. 4, which is a more detailed schematic of A/D converter 15, the square wave input to circuitry 13 item TRG is generated by frequency dividing the computer clock signal. The frequency divider comprises five 54LS93 circuits connected as illustrated and accomplishes a division by 262144. The clock frequency may be 18.0 MHz, thus producing an output square wave frequency of 68.66 Hz. The counter outputting the digitized $\alpha$'s to computer 17 comprises five 54LS93 circuits connected as shown. An appropriate one of the two $\alpha$ input ports is steered, by W and the steering logic, to appear at the NAND gate just preceding the counter, thereby controlling the number of individual clock counts entering the counter.

The read signal is a function of both the clear signal and the appropriate $\alpha$, and causes computer 17 to read the output of the counter just after the $\alpha$ being digitized goes high (logic 1).

FURTHER DESCRIPTION OF COMPUTER 17

A digital control and computational means, referred to hereinafter as a computer and typically implemented for instance as a microcomputer, is employed firstly to generate control signals w, x, y, and CL, secondly to respond to a read signal RD from the digital counting circuit by storing digital signal words $W_{TX}$, $W_{PX}$, $W_{TY}$, and $W_{PY}$ in its memory, and then thirdly to perform mathematical computations on the stored digital signal words appropriate to produce a digital output signal which is a suitably precise measurement of pressure. The interrelationship between the various signals may be as indicated in FIG. 5.

Figure 5:
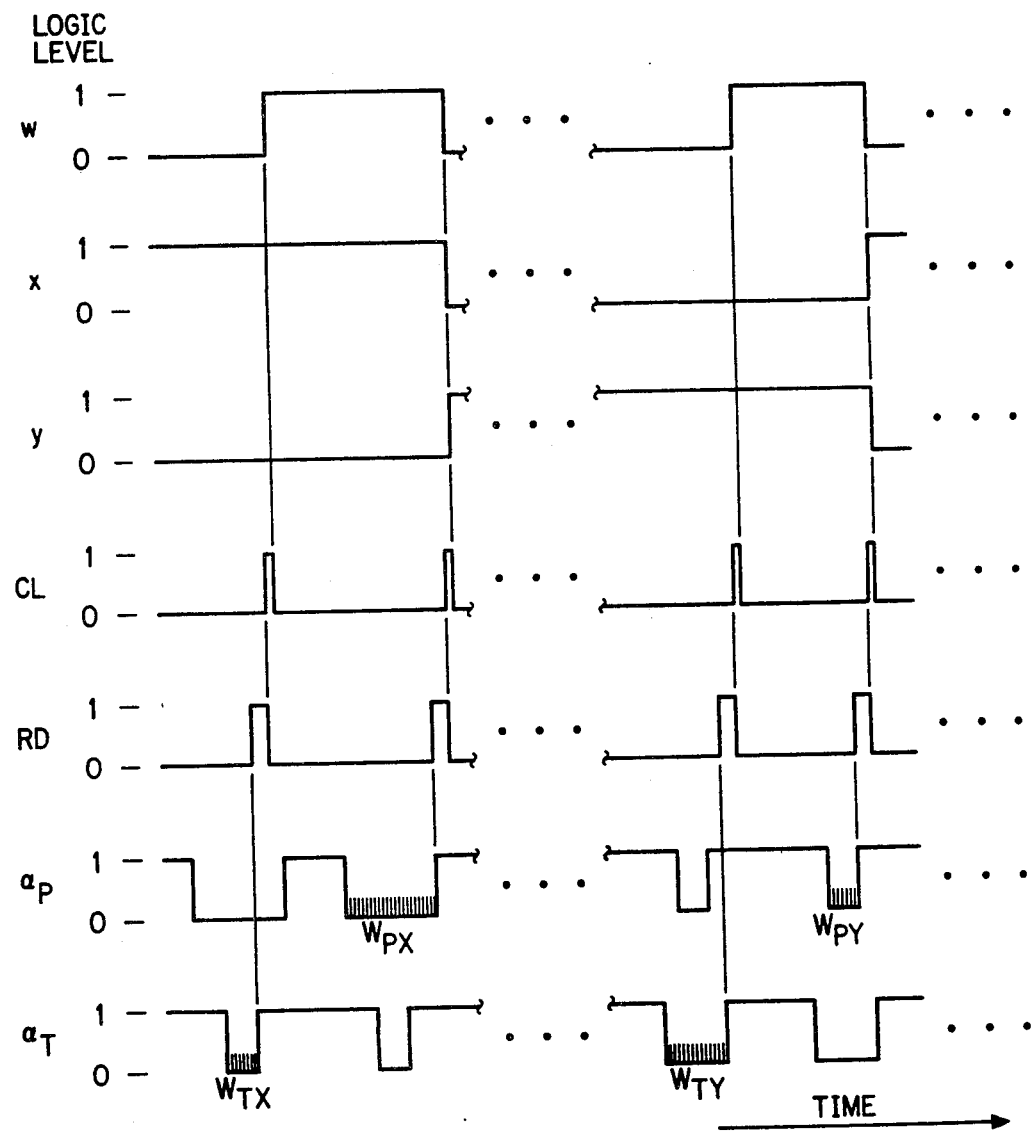
FIG. 5 shows waveforms useful in explaining the operation of the computer portion of FIG. 1.

FIG. 5 illustrates a sequence of states of signals w, x, and y which cause signal words $W_{TX}$, $W_{PX}$, $W_{TY}$, and $W_{PY}$. These states are defined more clearly in Table 1. As indicated, the computer

TABLE 1

| State No. | Control Signal w | Control Signal x | Control Signal y | Signal Word Produced |
|---|---|---|---|---|
| 1 | 0 | 1 | 0 | $W_{TX}$ |
| 2 | 1 | 1 | 0 | $W_{PX}$ |
| 3 | 0 | 0 | 1 | $W_{TY}$ |
| 4 | 1 | 0 | 1 | $W_{PY}$ | may generate control signals w=0, x=1, y=0 (State 1) which causes $W_{TX}$ to be produced in the counter. It is indicated by the counting marks the counting occurs when $a_T$ is low (logic 0). Upon completion of the count, or when $a_T$ returns to high (logic 1), the counter circuit sets the read signal RD to high, thus signalling that the count is complete and $W_{TX}$ is available. The computer responds to RD by reading $W_{TX}$ into its memory and then generating a clear pulse CL which clears the counter and resets signal RD to logic 0. The control values w−1, x=1, y=0 (state 2) are then generated and a similar procedure is followed to read and store $W_{PX}$. Similarly, states 3 and 4 are generated and the procedure is executed to read and store $W_{TY}$ and $W_{PY}$. States 1, 2, 3, and 4 may then be repeated to give continual periodic updating of the values of the signal words $W_{TX}$, $W_{PX}$, $W_{TY}$, and $W_{PY}$.

During the time periods indicated by the dotted lines in FIG. 5, the computer may perform the calculations (to be subsequently explained) appropriate to produce the output pressure signal. These time periods may be economically used for this purpose because, immediately after signals x and y are changed, the analog pulse width modulation circuit is in a transient state so that no meaningful values of the signal words $W_{TX}$, $W_{PX}$, $W_{TY}$, and $W_{PY}$ may be read; computational time thus does not detract from signal updating activity.

The calculations used to produce a precise output pressure signal accomplish several things. First, it should be expected that signal words $W_{TX}$, $W_{PX}$, $W_{TY}$, and $W_{PY}$ will contain significant levels of random noise. This is particularly likely when extreme precision in the output pressure measurement is sought, and considering that noise is the final limitation of nearly all precise measurements. The computer thus produces filtered versions $T_X$, $P_X$, $T_Y$, $P_Y$ of the signals $W_{TX}$, $W_{PX}$, $W_{TY}$, and $W_{PY}$ as, for instance, defined by the following:

$$T_{X(i)} = T_{X(i-1)} + \frac{[W_{TX(i)} - T_{X(i-1)}]}{2^n}$$

$$P_{X(i)} = P_{X(i-1)} + \frac{[W_{PX(i)} - P_{X(i-1)}]}{2^n}$$

$$T_{Y(i)} = T_{Y(i-1)} + \frac{[W_{TY(i)} - T_{Y(i-1)}]}{2^n}$$

$$P_{Y(i)} = P_{Y(i-1)} + \frac{[W_{PY(i)} - P_{Y(i-1)}]}{2^n}$$

In these equations, the subscript (i) is used to indicate the most recently updated value of a signal, while the subscript (i−1) indicates the most recent previous value of the signal. The i and (i−1) subscripts are deleted when there is no need to distinguish between present and recent values of the signals. Also in these equations, the denominator $2^n$ indicates division by a multiple of 2. When numbers are represented in binary form as they are in the computer, such division is very efficiently accomplished by shifting to the right. For example, if the integer parameter n is set to a value of 5, the denominator $2^n$ requires the binary numerator to be shifted 5 places to the right. Large values of n will result in higher degrees of filtering. In practice, the value assigned to n is related to the noise levels of the various signals, and should be determined experimentally.

A second feature of the calculations is that of subtracting such as to achieve error canceling, as has been previously explained. For instance, signals P and T may be produced by the following:

$$P = P_X - P_Y$$

$$T = T_X + T_Y$$

The subtraction indicated in defining P is highly desirable in that it eliminates any error component that is common to both $P_X$ and $P_Y$. The defining expression for T could also benefit by such a subtraction; however, since it has been observed that errors in T are not nearly as detrimental as errors in P, T is shown as employing addition rather than subtraction. Various embodiments of the invention may employ either addition or subtraction in computing T, depending upon the degree of precision to be achieved, but it is highly desirable that in all embodiments P be computed by subtraction.

A third feature of the calculations is that of producing the precision measurement of pressure based on the computed values P and T. It should be recognized that both P and T will be dependent upon both pressure and temperature. It will be observed that P is strongly related to pressure and weakly (but significantly) related to temperature, while T is weakly (but significantly) related to pressure and strongly related to temperature. Further, it will be observed that the relationships are typically non-linear. Still further, it will be observed that the exact nature of the various relationships varies from one piezoresistive pressure sensing device to another. Thus, the individual characteristic relationships are quantified for each sensing device based on pressure/temperature test data, and the resulting information is supplied to the computer for use in calculation of the output pressure signal. For example, output pressure signal $P_o$ may typically be found from the following calculations:

$$A_i = \sum_{h=0}^{4} A_{ih} T^h, \, i = 0, 1, 2$$

$$p_o = \sum_{i=0}^{2} A_i p^i$$

It should be understood that these equations represent polynomial expression such as, for i=0, the equation $$A_0 = A_{00} + A_{01}T + A_{02}T^2 + A_{03}T^3 + A_{04}T^4.$$

Then it can be appreciated that $A_0$, $A_1$, and $A_2$ are found from the first equation, and then the output pressure signal can be evaluated by use of the second equation. In this example it is apparent that 15 numbers $A_{00}$, $A_{01}$ - - - $A_{23}$, $A_{24}$ are used as coefficients of powers of T. These numbers are the quantified characteristics of the particular sensing device in use, as determined from pressure/temperature test data, and are permanently stored in computer memory for use in these calculations.

Of course there are other ways a computer receiving P and T could solve for and output a signal representative of pressure. These alternatives, depending on the particular application, may be more or less suitable or practical than the above-described technique. For example, since P and T are both functions of both pressure and temperature, i.e., P=$f_1$(pressure, temperature),
T=$f_2$(pressure, temperature), then a "look-up" table approach could be used. That is, since there is a particular pair of [P,T] values for each particular pair of [pressure, temperature] values, the exact correspondence could be determined, under controlled pressure and temperature conditions, and the data recorded. Then each particular [pressure, temperature] pair could be entered in memory so that when the corresponding [P,T] pair is incurred in operation, the pressure part of the [pressure, temperature] pair could be output. In-between values could be interpolated with suitable algorithms if desired.

As another alternative, the exact form of $f_1$ and $f_2$ could be determined from test data under controlled conditions and then, since the exact form of the two independent equations in two unknowns would be available, a computer-implemented iterative process could be used to solve for pressure.

VARIATIONS

Figure 6:
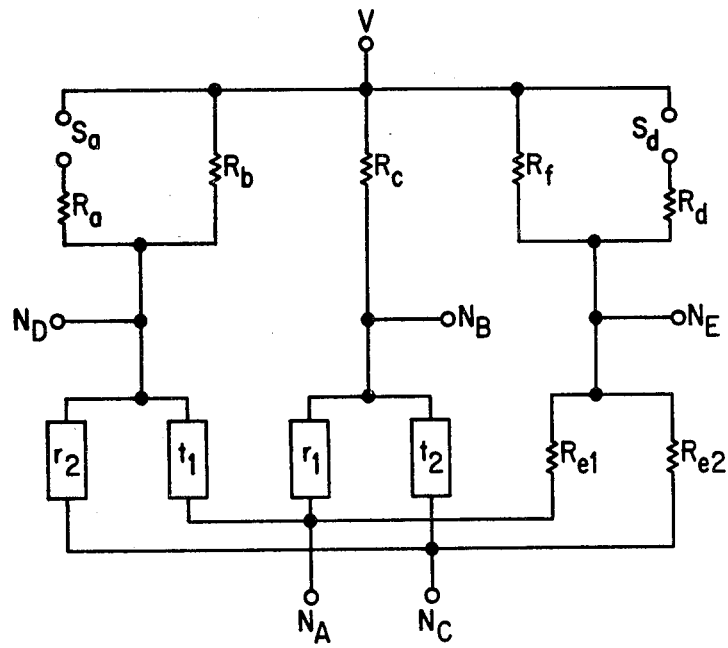
FIGS. 6, 7, 8, 9, 10, 11a and 11b are circuit diagrams showing alternatives for or variations in the FIG. 1 apparatus.
Figure 7:
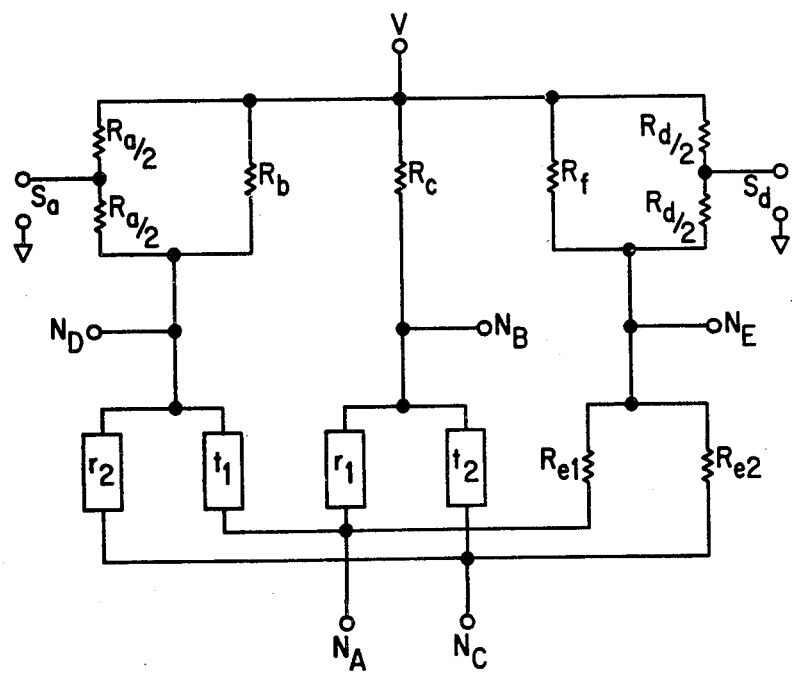

The method, as described herein, of error canceling to achieve extreme precision in the measurement of resistance ratios is applicable to a variety of situations in addition to the particular piezoresistor arrangement described above. This variety may be illustrated by first re-introducing the concept of a pressure module according to FIG. 3, as opposed to the elementary piezoresistive sensing device according to FIG. 1. More particularly, FIG. 6 shows a network of stable resistors along with four piezoresistors. It should be observed, first, that this network is merely a collection of components which have been previously presented, and, second, that these are the only components whose parameters enter into the equations describing the various signals $W_{TX}$, $W_{PX}$, $W_{TY}$, $W_{PY}$. The significance of this is that, when the characteristics of this network are quantified for storage in computer memory, the effects of all components that determine the outputs are included, rather than just those effects due to the piezoresistive device alone; the stored information applies to this module and is useful as long as this module remains intact. Further, since the stored information takes into account all of the component variations due to manufacturing tolerances, including tolerances of the stable resistors, it is no longer important that manufacturing tolerances be kept particularly tight. This offers a definite economic advantage when components are selected for application of this system.

Figure 8:
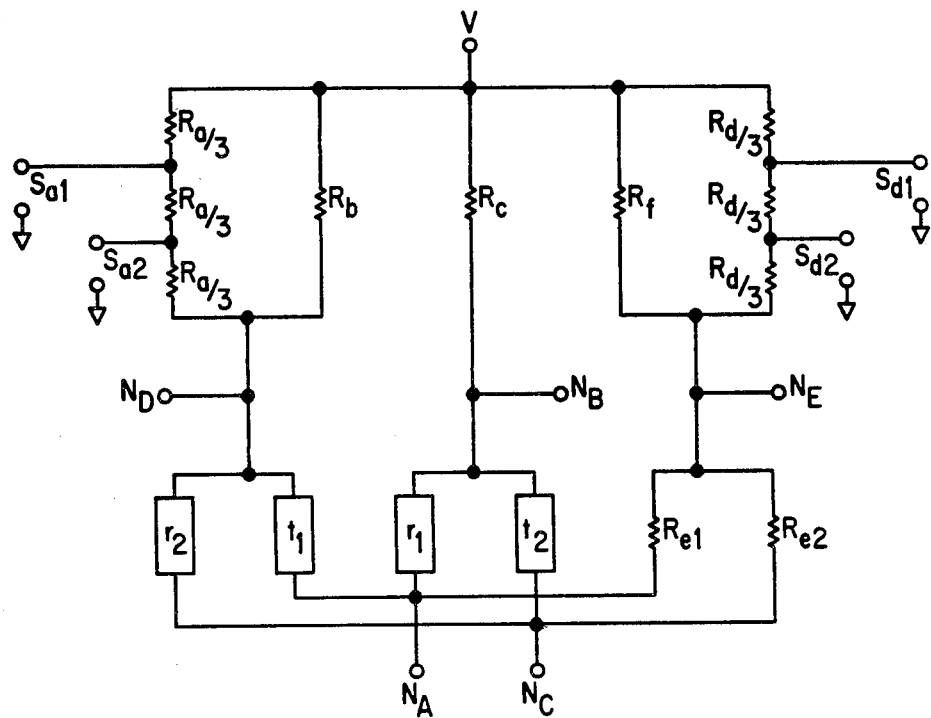

With the pressure module concept thus introduced, there appears numerous variations on the exact nature of the module. FIGS. 7 through 10 are examples of some possible and useful variations which have been evaluated. The network in FIG. 7 allows the use of shunting type switches rather than the series switches of FIG. 6. Further, FIG. 8 shows a network allowing the use of two switches, providing a cascade effect. These are variations that may be employed to deal with switch imperfections such as ON-resistance and OFF-leakage.

Figure 9:
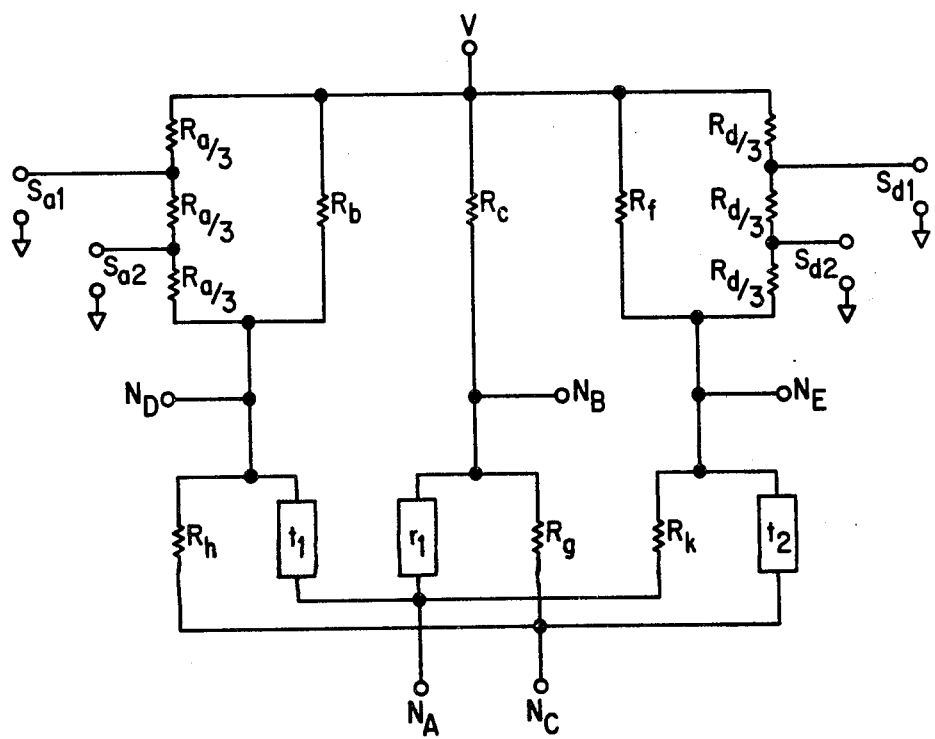

FIG. 9 presents a module that offers a different kind of advantage. With this, the signal words resulting are:

$$T_X = \left(\frac{R_d}{R_c}\right)\left(\frac{r_1}{R_k}\right) - \left(\frac{R_d}{R_f}\right) + \epsilon_T$$

$$T_Y = \left(\frac{R_d}{R_c}\right)\left(\frac{R_g}{t_2}\right) - \left(\frac{R_d}{R_f}\right) + \epsilon_T$$

$$P_X = \left(\frac{R_a}{R_c}\right)\left(\frac{r_1}{t_1}\right) - \left(\frac{R_a}{R_b}\right) + \epsilon_P$$

$$P_Y = \left(\frac{R_a}{R_c}\right)\left(\frac{R_g}{R_h}\right) - \left(\frac{R_a}{R_b}\right) + \epsilon_P$$

Upon subtraction, there results:

$$T = T_X - T_Y$$

$$= \left(\frac{R_d}{R_c}\right)\left[\left(\frac{r_1}{R_k}\right) - \left(\frac{R_g}{t_2}\right)\right]$$

$$P = P_X - P_Y$$

$$= \left(\frac{R_a}{R_c}\right)\left[\left(\frac{r_1}{t_1}\right) - \left(\frac{R_g}{R_h}\right)\right]$$

It may be observed that the error terms $\epsilon_T$ and $\epsilon_P$ have canceled in both calculations, since both involved a subtraction. With radially-oriented piezoresistors increasing and tangentially oriented resistors decreasing with pressure, and with all piezoresistors increasing with temperature, it can be appreciated that temperature effects are reinforced and pressure effects are suppressed in the calculation of T, and that pressure effects are reinforced and temperature effects are suppressed in the calculation of P. This is frequently a desirable achievement.

Figure 10:
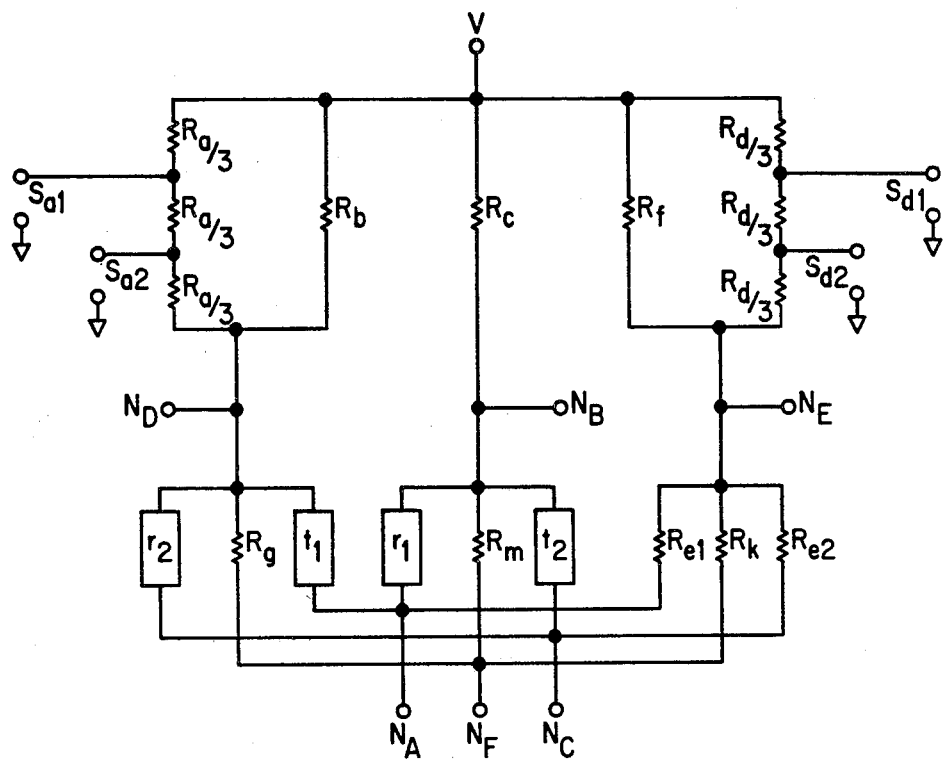

Still another variation is suggested in FIG. 10, from which it is possible to derive a third set of signals:

$$P_X = \left(\frac{R_j}{R_c}\right)\left(\frac{r_1}{t_1}\right) - \left(\frac{R_a}{R_b}\right) + \epsilon_P$$

$$P_Y = \left(\frac{R_a}{R_c}\right)\left(\frac{t_2}{r_2}\right) - \left(\frac{R_a}{R_b}\right) + \epsilon_P$$

$$P_Z = \left(\frac{R_a}{R_c}\right)\left(\frac{R_m}{R_g}\right) - \left(\frac{R_a}{R_b}\right) + \epsilon_P$$

$$T_X = \left(\frac{R_d}{R_c}\right)\left(\frac{r_1}{R_{e1}}\right) - \left(\frac{R_d}{R_f}\right) + \epsilon_T$$

-continued $$T_Y = \left(\frac{R_d}{R_c}\right)\left(\frac{t_2}{R_{e2}}\right) - \left(\frac{R_d}{R_f}\right) + \epsilon_T$$

$$T_Z = \left(\frac{R_d}{R_c}\right)\left(\frac{R_m}{R_k}\right) - \left(\frac{R_d}{R_f}\right) + \epsilon_T$$

The third set of signals $P_Z$ and $T_Z$ contain the same errors as the other members of each set, and can he used for canceling errors in each of these other members. This possibility may prove to be an advantage in applications where two virtually independent methods of calculating the output pressure signal are desired. That is, this approach offers a large degree of self-testing.

Figure 11A:
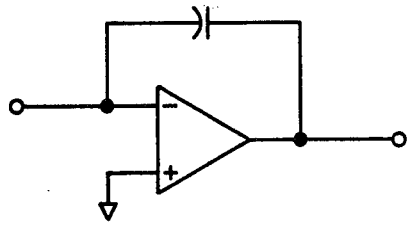
Figure 11B:
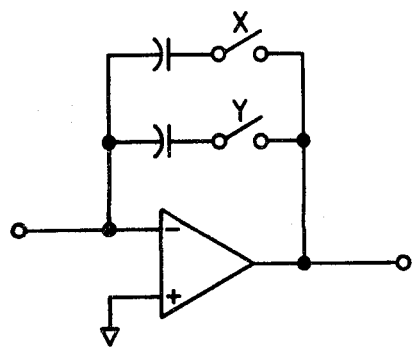

Another type of variation in the application of the method described herein is related to the integrator function which appears in the basic embodiment. FIG. 11a shows the integrator as presented in previous discussions of the method, while 11b suggests a concept which may be used to improve on the performance. It may be appreciated that the integrator input resistance element, which is normally considered in determining integrator gain, is assumed to be in the connecting input circuit of either 11a or 11b, and therefore is not shown in these figures. In comparing the two circuits, it can be appreciated that the integrator of FIG. 11a must slew rather slowly between two states as the measurement is changed from X to Y. In contrast, the integrator of FIG. 11b allows the two states to be remembered so that, when the measurement is changed from X to Y, no slewing time is required. When the Y measurement is commanded, the X switch opnns, the Y switch closes, and the output immediately assumes the level that existed the last time that the Y switch was closed.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. The electronic system comprising:
   (a) a predetermined number j of variable value resistors, wherein j is an integer $\geq 1$, and each of the j resistors is variable with one or more of two physical quantities, namely, $QT_1$ and $QT_2$,
   (b) a predetermined number m of fixed value resistors, m being an integer $\geq 1$,
   (c) means for generating (1) a first output having a signal characteristic $\phi_1$ which obeys a first function of one or more of the (j+m) resistors, and (2) a second output having a signal characteristic $\phi_2$ which obeys a second function of one or more of the (j+m) resistors, dependent variables $\phi_1$ and $\phi_2$ thus being dependent on, and thus having functional relationships with, one or more of the following arguments, namely: $QT_1$; $QT_2$; one or more of said fixed value resistors;
   (d) memory means containing customized data derived from previously conducted measurements of said functional relationships,
   (e) means for (1) receiving said customized data and said first and second outputs, and (2) using said customized data and $\phi_1$ and $\phi_2$ in a predetermined manner to provide output representative of at least one of $QT_1$ or $QT_2$,
   (f) wherein, (i) all of the resistors upon which $\phi_1$ and $\phi_2$ depend and (ii) said memory means, are wedded together as a set, whereby, nothing in (i) or (ii) is easily replaced without the entire set of (i) and (ii) being replaced.

2. The system as defined in claim 1 wherein each of said variable value resistors is a piezoresistor.

3. The system as defined in claim 2 wherein $QT_1$ is pressure and $QT_2$ is temperature.

4. The system as defined in claim 3 wherein said (e) means pressure.

5. The system as defined in claim 1, 2, 3, or 4 wherein j=4.

* * * * *

UNITED STATES PATENT AND TRADEMARK OFFICE
CERTIFICATE OF CORRECTION

PATENT NO. : 4,446,527
DATED : May 1, 1984
INVENTOR(S) : Wesley G. Runyan

It is certified that error appears in the above-identified patent and that said Letters Patent are hereby corrected as shown below:

Column 7, line 29, delete "w-1" and substitute therefor --w=1--.

Column 8, line 13, delete "Large" and substitute therefor --Larger--.

Column 10, line 56, delete "$\left(\frac{R_j}{R_c}\right)$" and substitute therefor --$\left(\frac{R_a}{R_c}\right)$--.

IN THE CLAIMS

Column 12, claim 4, line 39, delete "pressure" and substitute therefor --provides output representative of pressure--.

Signed and Sealed this

Twentieth Day of November 1984

[SEAL]

Attest:

GERALD J. MOSSINGHOFF

Attesting Officer

Commissioner of Patents and Trademarks